[12] United States Patent
Kokuyama

(10) Patent No.: US 10,634,563 B2
(45) Date of Patent: Apr. 28, 2020

(54) PHASE MEASUREMENT DEVICE AND INSTRUMENT IN WHICH PHASE MEASUREMENT DEVICE IS APPLIED

(71) Applicant: NATIONAL INSTITUTE OF ADVANCED INDUSTRIAL SCIENCE AND TECHNOLOGY, Tokyo (JP)

(72) Inventor: Wataru Kokuyama, Tsukuba (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 0 days.

(21) Appl. No.: 16/098,958

(22) PCT Filed: Apr. 27, 2017

(86) PCT No.: PCT/JP2017/016764
§ 371 (c)(1),
(2) Date: Nov. 5, 2018

(87) PCT Pub. No.: WO2017/191804
PCT Pub. Date: Nov. 9, 2017

(65) Prior Publication Data
US 2019/0086270 A1 Mar. 21, 2019

(30) Foreign Application Priority Data
May 6, 2016 (JP) .................... 2016-093389

(51) Int. Cl.
*G01J 9/02* (2006.01)
*G01R 29/26* (2006.01)
(Continued)

(52) U.S. Cl.
CPC ............. *G01J 9/02* (2013.01); *G01B 11/14* (2013.01); *G01R 25/00* (2013.01); *G01R 25/08* (2013.01);
(Continued)

(58) Field of Classification Search
CPC . G01J 9/02; G01B 11/14; G01R 25/00; G01R 25/08; G01R 29/26; H03D 13/00; H03L 7/091
(Continued)

(56) References Cited

U.S. PATENT DOCUMENTS 3,512,085 A 5/1970 Peterson et al.
5,001,724 A 3/1991 Birgenheier
(Continued)

FOREIGN PATENT DOCUMENTS

JP 2946675 9/1999
JP 2003-188863 12/2001
(Continued)

OTHER PUBLICATIONS

V. Friedman, "A Zero Crossing Algorithm for the Estimation of the Frequency of a Single Sinusoid in White Noise", IEEE Transactions on Signal Processing, vol. 42, No. 6, Jun. 1994 (Year: 1994).*
(Continued)

*Primary Examiner* — Sujoy K Kundu
*Assistant Examiner* — Douglas Kay
(74) *Attorney, Agent, or Firm* — Meunier Carlin & Curfman LLC

(57) ABSTRACT

A count processor counts a zero crossing detection count C. A fraction processor for calculating a fraction $F_j$ (j=1 to L) of the zero crossing detection count on the basis of the digital signal at sampling timings immediately before a zero crossing specifying and when the zero crossing specifying,
(Continued)

and computing a fraction processing parameter $G_j = N_j - F_j$ using a zero crossing detection number $N_j (0 \leq N_j \leq N-1)$ in a period corresponding to a sampling count N necessary for averaging determined in advance. The averaging is performed according to the following formula, where C is the output of the count processor at the end of an averaging period and $G_j$ (j=1 to L) is L fraction processing parameters (L indicates the number of $G_j$ included between the averaging counts N) computed by the fraction processor, and the phase of the digital signal is computed, whereby the phase is calculated on the basis of an input signal digital value obtained by an AD converter.

$$U = C - \frac{1}{N} \sum_{j=1}^{L} G_j \qquad \text{(Formula 1)}$$

9 Claims, 12 Drawing Sheets

(51) Int. Cl.
  *G01R 25/00* (2006.01)
  *H03D 13/00* (2006.01)
  *G01B 11/14* (2006.01)
  *G01R 25/08* (2006.01)
  *H03L 7/091* (2006.01)

(52) U.S. Cl.
  CPC ............. *G01R 29/26* (2013.01); *H03D 13/00* (2013.01); *H03L 7/091* (2013.01)

(58) Field of Classification Search
  USPC ........................................................ 702/189
  See application file for complete search history.

(56) References Cited

U.S. PATENT DOCUMENTS

| | | | |
|---|---|---|---|
| 6,522,983 B1* | 2/2003 | Dobos | G01R 13/02 356/5.08 |
| 7,571,339 B2* | 8/2009 | Stimple | H03L 7/0807 713/500 |
| 8,397,115 B2 | 3/2013 | Kimura | |
| 10,270,633 B2* | 4/2019 | Kokuyama | G01B 9/0201 |
| 2005/0220242 A1 | 10/2005 | Ogasawara | |
| 2007/0223634 A1 | 9/2007 | Haddad et al. | |
| 2007/0266275 A1* | 11/2007 | Stimple | H03L 7/0807 714/700 |
| 2017/0324596 A1 | 11/2017 | Kokuyama | |

FOREIGN PATENT DOCUMENTS

| | | |
|---|---|---|
| JP | 2006-270372 | 10/2006 |
| JP | 2007-232380 | 9/2007 |
| JP | 2012-217121 | 11/2012 |

OTHER PUBLICATIONS

D. Grillo and et al, "An Efficient Extension of the Zero-Crossing Technique to Measure Frequency of Noisy Signals", 978-1-4577-1772-7/12 ©2012 IEEE (Year: 2012).*
C.T.Nguyen and et al, "A new technique for rapid tracking of frequency deviations based on level crossings", IEEE Transaction on Power Apparatus and Systems, vol. PAS-103, No. 8, Aug. 1984 (Year: 1984).*
H. Voelcker, "Zero-Crossing Properties of Angle-Modulated Signals", IEEE Transactions on Communications, Jun. 1972. pp. 307-315 (Year: 1972).*
R. C. Wiley and et al, "A Practical Procedure for Estimation of Instantaneous Frequency", IEEE Transactions on Instrumentation and Measurement, vol. IM-30, No. 1, Mar. 1981 (Year: 1981).*
International Search Report (English) and Written Opinion dated Jul. 11, 2017, from International Application No. PCT/JP2017/016764, 8 pages.
Extended European Search Report issued in the EP Patent Application No. EP17792737.3, dated May 20, 2019.

* cited by examiner

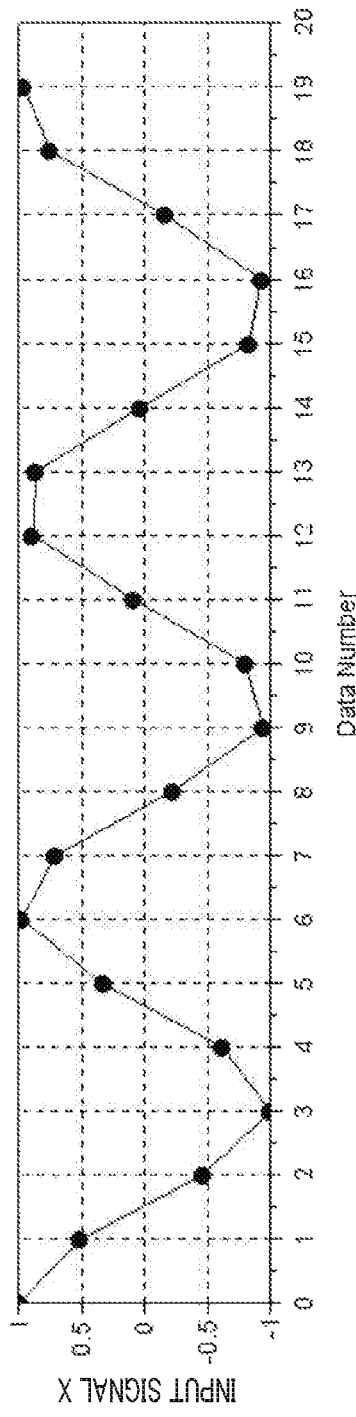
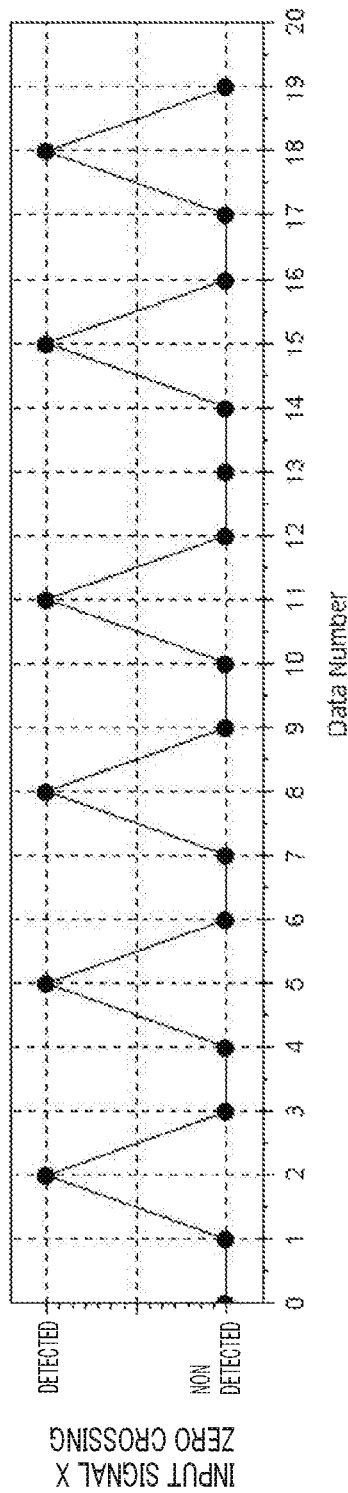
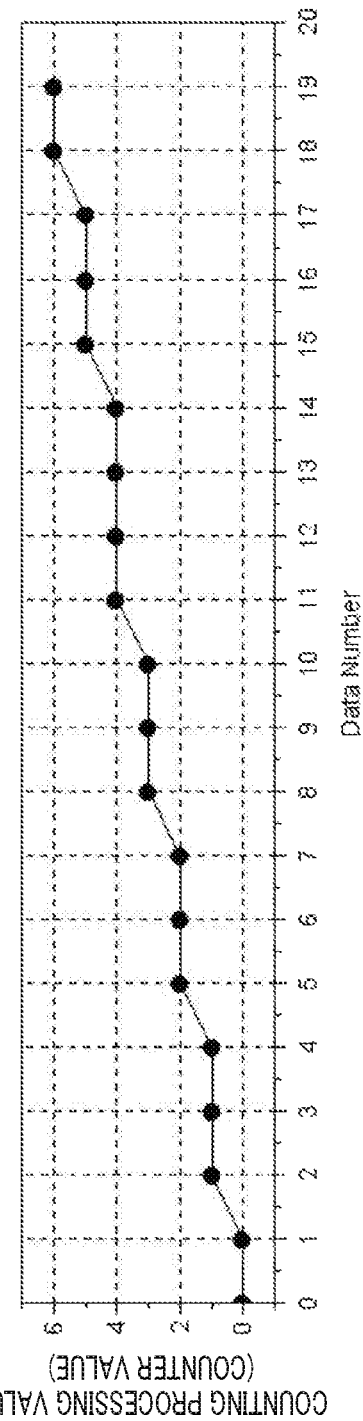
FIG. 3A
FIG. 3B
FIG. 3C

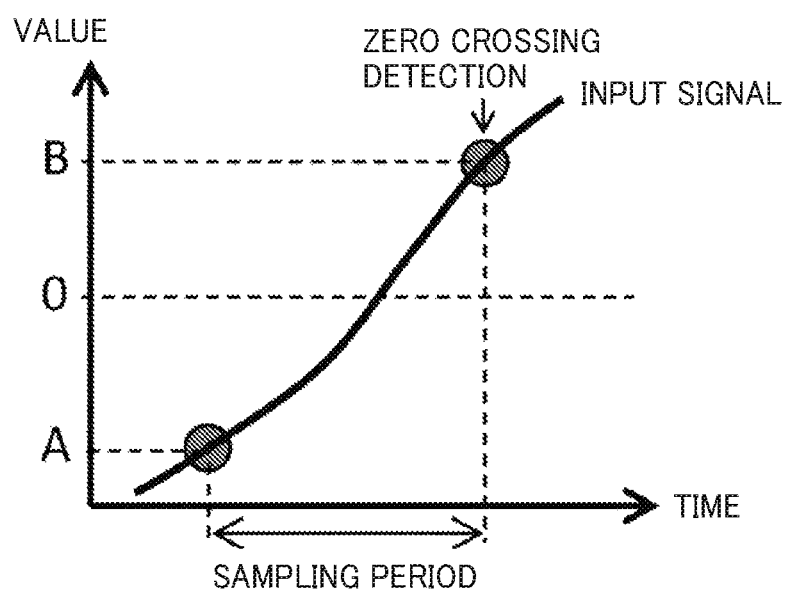

FIG. 10

| | DEMODULATION TECHNIQUE | COUNTING TECHNIQUE | ZERO CROSSING ANALYSIS TECHNIQUE | PRESENT INVENTION |
|---|---|---|---|---|
| MEASUREMENT RESOLUTION | ○ GOOD | ▲ THERE IS LIMIT (SINCE OUTPUT VALUE IS INTEGER VALUE.) | ○ GOOD | ○ GOOD |
| SPEED RANGE OF MEASUREMENT TARGET | ▲ NARROW (SINCE LOW PASS FILTER IS NECESSARY.) | ○ WIDE | ○ WIDE | ○ WIDE |
| REAL-TIME PROCESS (IS MEMORY NECESSARY?) | ○ POSSIBLE | ○ POSSIBLE | ▲ IMPOSSIBLE (SINCE ZERO CROSSING TIME IS MULTIPLIED AND ESTIMATED) | ○ POSSIBLE |
| NECESSARY CLOCK SPEED | ○ LOW | ▲ HIGH | ○ LOW | ○ LOW |
| PROCESSING COMPLEXITY | ▲ COMPLICATED (MANY ARITHMETIC OPERATIONS SUCH AS MULTIPLYING REFERENCE SINUSOIDAL WAVE ARE NECESSARY.) | ○ SIMPLE | ▲ COMPLICATED (MANY ARITHMETIC OPERATIONS ARE NECESSARY FOR DERIVATION AND ANALYSIS OF ZERO CROSSING TIME) | ○ SIMPLE |
| RESISTANCE TO AMPLITUDE VARIATION OF SIGNAL | ▲ WEAK (INFLUENCED BY AMPLITUDE VARIATION SINCE MEASUREMENT VALUE OTHER THAN ZERO CROSSING IS USED) | ○ STRONG | ○ STRONG | ○ STRONG |

POSITION AT WHICH ZERO CROSSING IS LOST

PHASE MEASUREMENT DEVICE AND INSTRUMENT IN WHICH PHASE MEASUREMENT DEVICE IS APPLIED

TECHNICAL FIELD

The present invention relates to a phase measurement device that measures a phase of an input signal (hereinafter referred to as a "periodic input signal") which periodically changes like a sinusoidal wave or a phase difference between periodic input signals with a digital circuit and an instrument in which the phase measurement device is applied.

BACKGROUND ART

A device that measures a phase or a phase difference of a periodic input signal with a digital circuit (hereinafter referred to as a "phase measurement device") is a most fundamental component in wireless communication, high-frequency signal processing, and high-accuracy frequency measurement. Since a frequency can be calculated by differentiating phase information obtained by the phase measurement device by time, it is also used as a frequency counter. In wireless communication or wired communication, high-speed high-capacity communication has been sought in recent years, and a phase noise of a reference signal source is one of factors limiting performance. Therefore, for example, a device (hereinafter referred to as a "phase noise measurement device") that measures a phase time history, power spectrum, Allan deviation, and the like of one periodic input signal is used in order to evaluate the reference signal source.

Further, a phase measurement device that measures a phase difference between two periodic input signals (hereinafter also referred to as a "phase difference measurement device") is widely used as an element constituting many measurement/control instruments. For example, in a laser heterodyne displacement measurement device, the phase difference measurement device is applied to demodulate displacement of a measurement target from an optical modulation signal. Even in a power control system, it is necessary to measure AC power, voltage and current signals which periodically vary, and the phase difference measurement device is incorporated in a part of the system. Particularly, with the demand for miniaturization of the power control system, it is desired to have a simple structure while maintaining the accuracy of the phase difference measurement device.

A phase-locked loop (hereinafter referred to as a "PLL circuit") is a circuit which is widely used for a communication instrument or a measurement device, and a phase difference measurement device that measures a phase difference is applied as an internal element thereof. In some physical quantity measuring sensors such as an angular velocity detecting sensor (also referred to as a gyro sensor), since the PLL circuit is incorporated therein, there are sensors including the phase difference measurement device therein. In addition, a phase difference measurement device that measures a phase difference between digital pulse signals (which indicate signals whose waveform is a square wave) is widely used mainly for communication instruments or the like.

In the phase measurement device or the phase difference measurement device, since performance such as measurement accuracy, resolution, a dynamic range, or the like influences final system performance, research and development for increasing convenience while increasing the performance of the measurement devices have been conducted. In recent years, a device that converts an input signal to digital data through an AD (analog to digital) converter and then measures a phase or a phase difference by digital processing (hereinafter referred to as a digital phase measurement device or a digital phase difference measurement device) has started to appear, particularly, due to convenience of implementation and interface with a computer.

As a technique of measuring a phase or a phase difference of a periodic input signal by processing digital data, several methods have been known from the past, and it can be roughly classified into a demodulation technique, a counting technique, and a zero crossing technique.

First, the demodulation technique will be described. In the demodulation technique, a reference signal is generated in a circuit, and a phase of an input signal is detected by multiplying the reference signal by the input signal, and it is possible to implement a phase measurement device by performing the process on a periodic input signal. In this method, generally, high accuracy phase measurement is possible, but there is a problem in that demodulation is unable to be performed when a frequency of the input signal is significantly different than the reference signal. Further, when an amplitude of the input signal changes in a short time due to influence of noise or the like from the outside, there is a problem in that the measurement accuracy is adversely affected. In addition to the method of multiplying the reference signal as described above, for example, there is a method of generating a quadrature phase signal by Hilbert transformation and calculating a phase by an inverse tangent arithmetic operation, but these methods can be classified into the demodulation technique and have a similar problem.

Next, the counting technique is an already known technique of counting the number of zero crossings of a periodic signal using a counter and calculating a phase from a count value. It can be implemented with a very simple circuit configuration on the basis of the principle, but since it is possible to calculate only a phase of an integral multiple of a signal period, the accuracy is limited. In this regard, various researches have been conducted to improve the accuracy of the counting technique.

For example, a technique of arranging a PLL circuit at a preceding stage and applying the counting technique after multiplying the frequency of the periodic input signal has been proposed, and it is possible to amplify a minute phase change of the input signal and improving the accuracy through this technique. However, since a response speed of the PLL circuit is limited, reliability of measurement decreases when the frequency of the periodic input signal varies drastically (when the phase variation is severe). Further, a method of improving accuracy by a combination of a simple counting technique and a counting technique using a higher frequency clock has been also proposed, but there is a problem in that the high frequency clock is necessary, and a circuit configuration and signal processing are complicated. Furthermore, a technique of calculating and correcting a decimal part by a linear interpolation operation before and after a zero crossing point in order to correct a count value for which only an integer value is obtained has been also proposed. However, even though the correction is added, since only a count value at an end point within a certain measurement time (also referred to as a gate time) is used, a measurement resolution is limited.

On the other hand, in the zero crossing technique, a time of a point at which the periodic input signal crosses zero (zero crossing) is measured, and the phase of the signal is calculated on the basis of it. Specifically, the phase difference of the periodic input signal is calculated on the basis of data accumulated in a memory using the fact that a time interval in which the signal crosses zero is proportional to a reciprocal of a frequency. However, in this method, since the phase is estimated from data between two neighboring measurement points among the data accumulated in the memory, there is a problem in that the measurement time is limited by a memory capacity. Further, since it is necessary to perform conversion from a time of zero crossing to a phase, a computation load is large due to signal processing or the like, and it is difficult to implement a real-time process.

In order to improve the performance of the phase measurement device, it is effective to integrate a plurality of techniques so that the disadvantages of the respective techniques are complemented. In particular, integration of the counting technique capable of coping with the high-speed phase change and the zero crossing technique capable of coping with the high accuracy phase measurement is extremely effective since it is possible to implement a measurement device that can achieve both a high-speed process and accuracy without using a complicated digital process as in the demodulation technique.

From this viewpoint, for example, a technique of detecting a phase difference through a combination of a counting technique using an up/down counter as a phase difference measurement device applied to a laser heterodyne interferometer and a zero crossing technique using a triangle wave generated from an input signal is disclosed in Patent Document 1.

Further, a technique in which a digital phase difference measuring unit is used as a part of a phase-locked loop, AD conversion is performed on an input signal, and a phase difference between a sinusoidal input signal and a clock held therein is obtained by processing it with a clock generating unit, a phase comparing unit, and a phase correcting unit is disclosed in Patent Document 2. In a principle of the phase difference measurement unit, the input signal is first digitized by the AD converter, and an input signal digital value is generated. Then, a "sign clock" indicating whether a digital value of the input signal is positive or negative is generated by the clock generation unit. Then, the phase comparing unit performs counting on the basis of a high-speed "count clock" held therein using a sign clock. At the same time, the phase correcting unit calculates a phase correction value through a linear interpolation operation for data before and after a zero crossing point of the input signal digital value, calculates a sum of an output value of the phase comparing unit and the phase correction value, and obtains a desired phase difference.

Patent Document 3 discloses a method of performing AD conversion on an input signal and performs detection and correction of a phase error as a device that detects a phase error (synonymous with a phase difference in this specification). The detection of the phase error is carried out by an equalization unit having a predetermined equalization characteristic, a binarization unit that binarizes a signal output from the equalization unit, and an arithmetic operation unit that calculates a desired phase error signal by a metric operation from an output of the equalization unit and the binarization unit. As a method of realizing the correction, there is a method of determining whether or not a previous phase error history is within a predetermined range and performing correction so that an error falls within the range when an error outside the range is detected.

As a frequency measurement method and device, a method of performing an interpolation operation on amplitude values before and after the zero crossing point of the periodic input signal, calculating a time of the zero crossing point gradually, and calculating a frequency of the periodic input signal from a reciprocal of a difference in the time of the zero crossing point is disclosed in Patent Document 4. This method is also included in the "zero crossing technique".

Patent Document 1: Japanese Patent No. 2946675
Patent Document 2: Japanese Unexamined Patent Application, Publication No. 2012-217121
Patent Document 3: Japanese Patent No. 5468372
Patent Document 4: Japanese Unexamined Patent Application, Publication No. 2007-232380

DISCLOSURE OF THE INVENTION

Problems to be Solved by the Invention

However, in the technique disclosed in Patent Document 1, a high accuracy analog circuit is necessary to cause an analog triangular wave signal to be generated inside the device. For this reason, there is a problem in that a noise and a change in characteristic of the analog part are irregular elements for performance. Further, in the technique disclosed in Patent Document 2, since a plurality of clocks such as a sampling clock and a count clock are internally used, the circuit configuration is complicated. Further, for example, when the phase of the sinusoidal input signal varies greatly, there is a problem in that the phase difference is not accurately reflected in the count value in the phase comparing unit. Furthermore, the calculation value of the phase difference between the sinusoidal input signal and the clock held therein is corrected by the phase correcting unit, but the resolution thereof is limited to the resolution of the AD conversion. Further, since only a phase at the moment of end of one period of the sinusoidal input signal is used for measurement, there is also a problem in that influence in which a phase variation earlier than the period of the sinusoidal input signal is mixed into the measurement result as aliasing is unable to be removed. In the technique disclosed in Patent Document 3, the calculated phase difference is added by a value of an integral multiple of ±360° by correction and adjusted so that it is a value within ±180° accordingly. For this reason, for example, when an actual phase difference exceeds ±180°, there is a problem in that a true value of the phase difference is not reflected.

Further, the techniques disclosed in Patent Document 2 and Patent Document 3 are intended to measure the phase difference between a single sinusoidal input signal and a reference clock held therein, and the phase of the periodic input signal whose frequency changes diversely is unable to be measured. In the technique disclosed in Patent Document 4, the real-time arithmetic operation is performed using the DSP, but since a frequency which can be calculated in real time is limited by a calculation speed of the DSP, there is a limitation to the frequency of the periodic input signal which can be measured. Further, since calculating the frequency is a subject, it is not intended to calculate the phase of the periodic input signal, and even if the phase is calculated, the error is large. Further, in all the techniques disclosed in Patent Document 2 to Patent Document 4, the frequency phase is calculated from the time of one period of the input signal, and thus the measurement value is output in each period of the input signal. For this reason, when the frequency of the input signal greatly changes, the time interval at which the measurement value is calculated largely varies depending on the input signal. Particularly, in digital signal processing in which signal processing is performed with a certain clock, since it is a factor that causes load increase, response delay, complication of the circuit configuration in a subsequent process, it is desirable to calculate a result at equal time intervals even when the frequency of the input signal greatly varies.

In this regard, it is an object of the present invention to provide a digital phase measurement device capable of calculating a phase from an input signal digital value obtained by an AD converter with a simpler process so that a periodic signal of a wide frequency range can be input and measuring a phase or a phase difference in real time at equal time intervals with a high degree of accuracy.

Means for Solving the Problems

In the present invention, in order to implement simple and robust high-accuracy phase measurement, a counting technique and a zero crossing technique are applied to a periodic input signal, and results thereof are added while integrating the results (this is referred to as an averaging process). Specifically, a phase measurement device of the present invention is a phase measurement device that measures a phase of a periodic input signal varying periodically through a digital circuit, and includes an AD converter that digitizes the periodic input signal at each predetermined sampling timing and outputs a digital signal, a zero crossing specification means that detects a change in a sign of the digital signal, a count processor that counts and calculates a zero crossing detection count C through the zero crossing specification means at each sampling timing, a fraction processor that calculates a fraction $F_j$ (j=1 to L) of the zero crossing detection count on the basis of the digital signals at sampling timings immediately before and immediately after the zero crossing specification means determines zero crossing and further calculates a fraction processing parameter $G_j = N_j - F_j$ using a zero crossing detection number $N_j$ ($0 \leq N_j \leq N-1$) in a period of a predetermined sampling count N (the number of data to be averaged) necessary for averaging, and an averaging processor that averages the count processor calculation value that is the zero crossing detection count C when the period ends and L fractions calculated by the fraction processor in a period of the sampling count N using Formula 1 and calculates a phase of the digital signal.

$$U = C - \frac{1}{N} \sum_{j=1}^{L} G_j \quad \text{(Formula 1)}$$

Further, a phase difference measurement device which measures a phase difference according to the present invention includes the above-described phase measurement device arranged as each of first and second phase measurement devices for a first periodic input signal X and a second periodic input signal Y, the periodic input signal including the first periodic input signal X and the second periodic input signal Y and a subtractor that subtracts a phase of the second periodic input signal Y measured by the second phase measurement device from a phase of the first periodic input signal X measured by the first phase measurement device, in which the phase difference measurement device measures a phase difference between the first periodic input signal X and the second periodic input signal Y.

Effects of the Invention

Here, if a frequency of an input signal is indicated by $f_I$, a sampling rate for driving an AD converter is indicated by $f_{ADC}$, the number of conversion bits of the AD converter is indicated by n, and an averaging count is indicated by N, according to the present invention, a rate at which a phase is finally calculated by an averaging process can be $f_{ADC}/N$. Accordingly, the following effects are obtained.

(1) Wide Input Signal Frequency Range

As the present invention is applied, it is possible to measure even when the frequency of the input signal has a wide band. Specifically, sufficient measurement can be performed within a range of $f_{IN} < f_{ADC}/4$.

(2) High Resolution

If a phase resolution is indicated by d (unit radians), according to the present invention, since there is a relation of $d = 2\pi/(N \cdot 2^n)$, the resolution of the phase measurement can be increased.

(3) Real-Time Process

It is possible to process a signal in real time and calculate a phase continuously for a long time. For example, if it is implemented in an FPGA, it is possible to continuously obtain a desired phase at a rate of $f_{ADC}/N$ without time delay. The above effects are similarly obtained even when a phase difference is measured using the phase measurement device of the present invention.

BRIEF DESCRIPTION OF THE DRAWINGS

FIGS. 3A to 3C are diagrams for describing an operation of a count processor according to the present invention.

FIG. 6 is a diagram for describing a relation between an input signal and zero crossing detection.

FIG. 10 is a diagram for describing advantages of Example 3 compared to a related art.

PREFERRED MODE FOR CARRYING OUT THE INVENTION

Example 1

A basic principle of a phase measurement device according to the present invention will be described with reference to the appended drawings. Hereinafter, a periodic input signal in the phase measurement device is referred to as an "input signal X".

Figure 1:
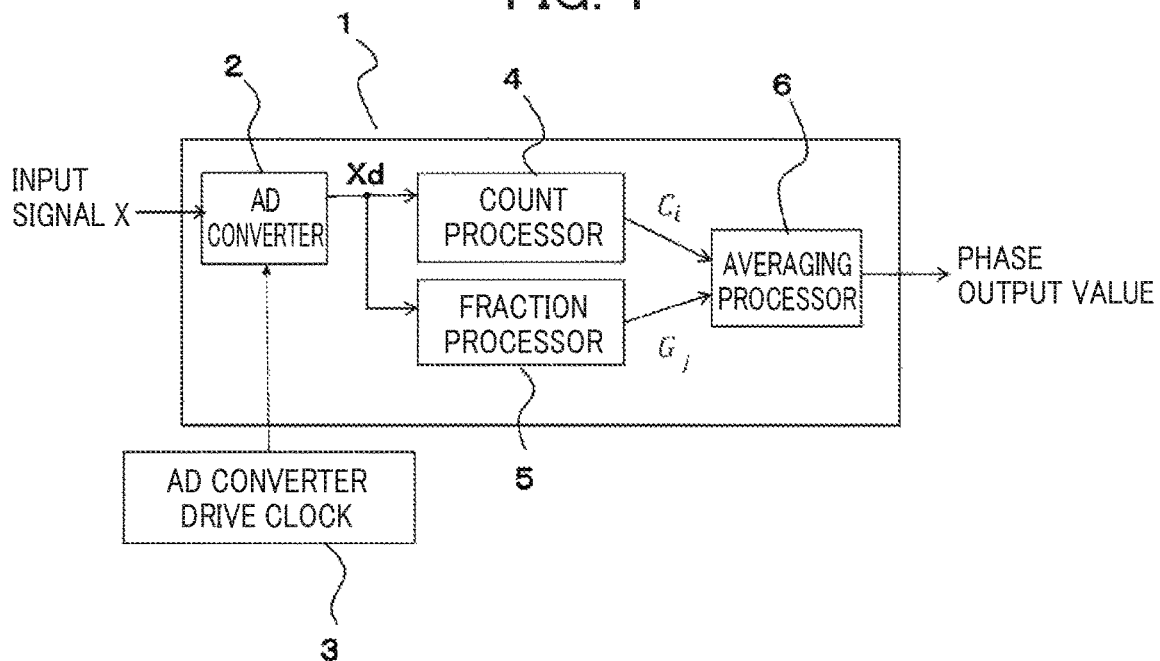
FIG. 1 is a diagram illustrating an overview of signal processing in a phase measurement device of the present invention.

FIG. 1 illustrates an overview of digital signal processing by a phase measurement device 1 according to the present invention. The input signal X is digitized by an AD converter 2 and output as Xd. A drive clock 3 for driving the AD converter 2 is input to the AD converter 2. The converted digital data Xd is transmitted to and processed by a subsequent digital signal processor. As illustrated in FIG. 1, the digital signal processor includes three units, that is, a count processor 4, a fraction processor 5, and an averaging processor 6. Hereinafter, functions of three points, that is, the count processor 4, the fraction processor 5, and the averaging processor 6 will be described in order. Further, an averaging count N is previously determined in accordance with a rate at which data is finally obtained. In other words, it is because 1/N of a sampling rate at which the AD converter 2 operates is a sampling rate at which output data is finally obtained. For example, if the sampling rate of the operation of the AD converter is 500 MHz, and a desired phase calculation rate is 25 MHz, it is preferable that N=20 be decided.

(Count Processor)

Figure 2:
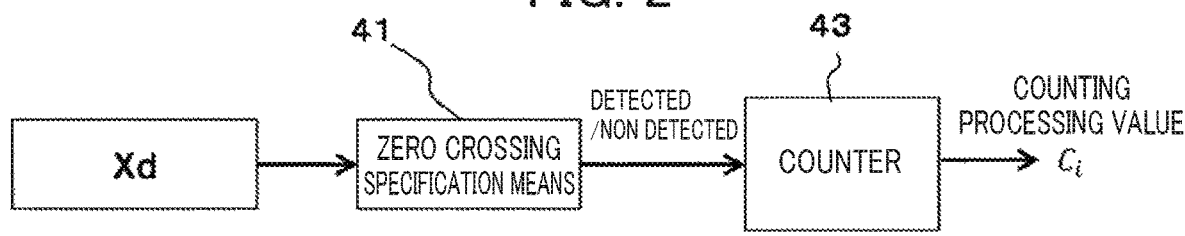
FIG. 2 is a block diagram of a count processor according to the present invention.

FIG. 2 is a block diagram of the count processor 4. An operation will be described in detail with reference to FIG. 3. Here, a horizontal axis is a data number i of each sampling timing. In other words, an example in which data is sequentially input and processed for each drive sampling rate of the AD converter 2 in order from the left (i=0 is set as the beginning) is illustrated. In other words, a data interval in FIG. 3 corresponds to a drive sampling rate of the first AD converter 2 (a period of the drive clock 3). First, data Xd obtained by digitizing an input signal X by the AD converter 2 corresponds to FIG. 3A. Here, the count processor 4 detects zero crossing at which a sign of the data Xd is switched by a zero crossing specification means 41. For example, a signal obtained by detecting timings of zero crossing and setting a positive logic directly after crossing with a data number at which zero is exceeded in FIG. 3A is a signal of FIG. 3B. It is possible to detect the zero crossing as described above.

Then, the signal illustrated in FIG. 3B is input to a counter 43, and a counting process is performed. The counter 43 counts up each time a detection signal arrives from the zero crossing specification means 41, and values held in the counter 43 are illustrated in FIG. 3C. When a frequency of the input signal X is much smaller than the drive sampling rate of AD converter 2, the zero crossing may be erroneously detected due to influence of the input signal or noise included in the AD converter 2. In this case, it is not a problem because the erroneous detection can be ignored by a well-known algorithm.

(Fraction Processor)

Figure 4:
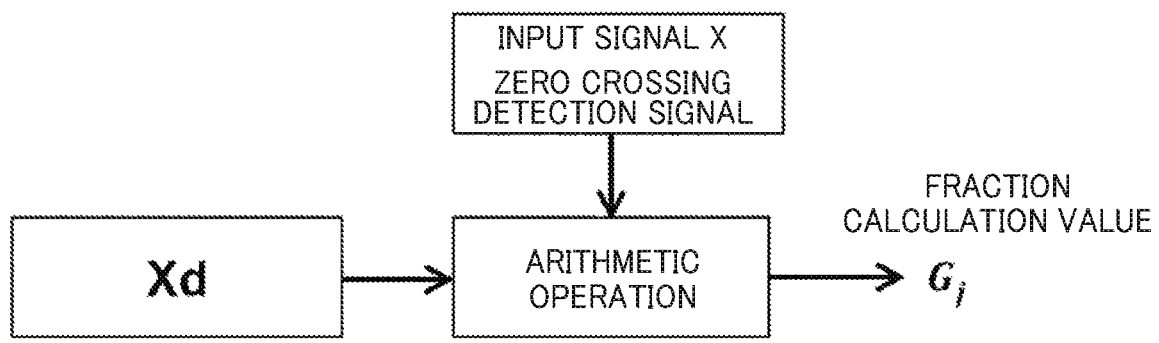
FIG. 4 is a block diagram of a fraction processor according to the present invention.

Next, FIG. 4 illustrates an overview of the fraction processor 5. An operation of the fraction processor 5 will be described in detail below with reference to FIGS. 5 and 6. First, a digital data sequence Xd obtained by converting the input signal X by the first AD converter 2 corresponds to FIG. 5A. This is exactly the same as FIG. 3A. Then, a linear interpolation operation process is performed. Specifically, a value (a value B in FIG. 6) at a timing when zero crossing of a measurement signal is detected and an immediately previous value (a value A in FIG. 6) are latched. For example, a linear interpolation operation indicated by Formula 2 is performed using the two pieces of data.

$$|B|/(|A|+|B|) \qquad \text{(Formula 2)}$$

The calculation value is held in association with the zero crossing detection timing (the same timing as the value B in FIG. 6) and indicated by $F_j$. Furthermore, fraction processing parameter $G_j$ is defined as follows:

$$G_j = N_j - F_j \qquad \text{(Formula 3)}.$$

Figures 5A, 5B:
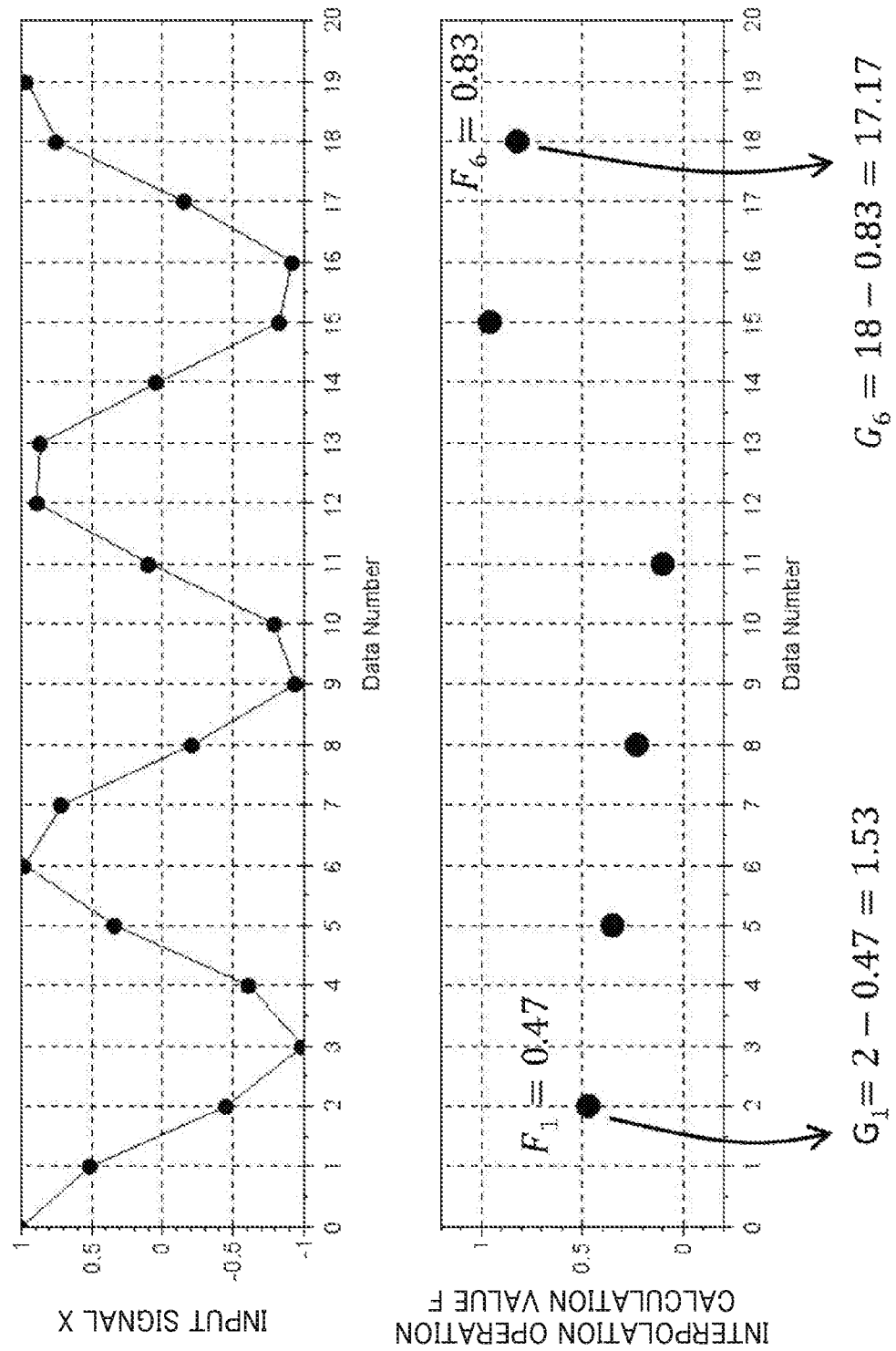
FIGS. 5A and 5B are diagrams for describing an operation of a fraction processor according to the present invention.

At this time, $N_j$ is a number indicating a position in N-th data of the zero crossing detection timing. In other words, the number $N_j$ is the corresponding sampling count when the J-th zero crossing is detected, and $0 \le N_j \le N-1$, and $N_j$ is 2, 5, 8, 11, 15, or 18 in the example of FIG. 5. FIG. 5B illustrates this example.

Since the zero crossing is detected at the data number 2 in FIG. 5B (see FIG. 3B), and a calculation value (approximately 1.53) is obtained by calculating Formula 1 using the values of the data number 1 and the data number 2 and associated with a time point of the data number 2. Similarly, fraction calculation values are obtained even at the time points of the data numbers 5, 8, 11, 15, and 18.

In the operation of the fraction processor 5, it is necessary to detect the zero crossing of the input signal X. The zero crossing detection operation may be implemented by performing an independent zero crossing detection process in the fraction processor 5 or may be implemented by transmitting the detection signal from the outside of the fraction processor 5, for example, the count processor 4.

Further, division is included in this process, but a load is large when a high-speed floating point calculation (division) is performed in the FPGA. It is also possible to apply division using a "lookup table" in order to reduce the load. When the division using the lookup table is applied, an error from an exact value of Formula 1 occurs in a fraction calculation value. However, the fraction calculation value is a part corresponding to a correction term of a final result and has a small influence on the final result. Therefore, this replacement does not cause the deterioration of the measurement accuracy.

(Averaging Processor)

Next, an operation of the averaging processor 6 will be described. The averaging processor 6 performs an arithmetic operation process of a phase output value U on two data sequences obtained from the count processor 4 and the fraction processor 5 on the basis of the following Formula 1. At this time, the phase output value U can be calculated in accordance with the following Formula.

$$U = C - \frac{1}{N} \sum_{j=1}^{L} G_j \qquad \text{(Formula 1)}$$

Here, N indicates an averaging count, C indicates an output value of the counter 43 when the averaging count is reached, $G_j$ indicates a calculation result of the fraction processor 5 in j-th zero crossing calculated by Formula 2, and L indicates the number of $G_j$ included between the averaging counts N. For example, in the example of FIG. 3, N=20, C=6, and L=6.

In PCT/JP/2015/081984 previously proposed by the inventors, in order to obtain U, it is necessary to perform the integration operation on the output of the counter 43 for each sampling of the AD converter in the averaging processor. In order to calculate the value of U with a high degree of accuracy, it is necessary to set a wide bit width as U, and thus it is necessary to perform the integration operation on a numerical value of a wide bit width for each high-speed sampling of the AD converter, a strong calculation load is imposed to an FPGA, and the reduction becomes a problem. According to Formula 1, for example, it is possible to calculate a final measurement value U only by performing a necessary minimum cumulative addition process corresponding to a total of the number C of zero crossings occurring during predetermined averaging counts (C=6 in the example of FIG. 3), and it is possible to remarkably reduce the calculation load as compared with the previous proposal. Further, when correction for sensitivity improvement is applied as in Example 4 to be described later, in the previous proposal, a complicated procedure is necessary to calculate a position of lost zero crossing in real time, and a heavy load is imposed to a computer. In comparison, in the present example, using the fact that $G_j$ is the value indicating the position of zero crossing, it is possible to easily interpolate the position of lost zero crossing. In other words, it is possible to perform the correction in real time and thus improve measurement sensitivity of the present method even on a low-cost small-sized FPGA.

Further, when the above-described averaging process is actually implemented in the FPGA, it may be performed as follows in order to secure real-time performance.
(1) At a timing of each data number, data of $C_i$ and $G_j$ output from the count processor 4 and the fraction processor 5 is transmitted to the averaging processor 6.
(2) The averaging processor 6 includes a memory (an initial value is set to 0), adds the received $G_j$ to its own value at each timing, and holds it until a next data reception timing. In other words, a memory holding value $S_i$ follows a recurrence formula of Formula 4.

$$S_i = S_{i-1} + G_j \quad \text{(Formula 4)}$$

Figure 7A:
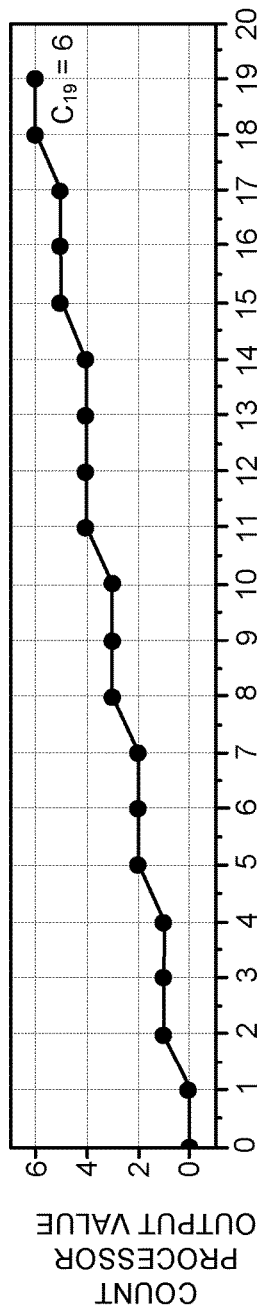
FIGS. 7A to 7C are diagrams for describing an operation until an averaging process is performed.
Figure 7B:
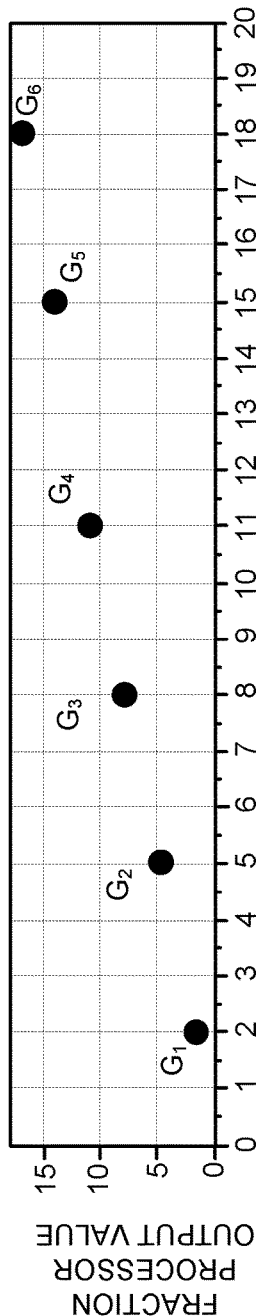
Figure 7C:
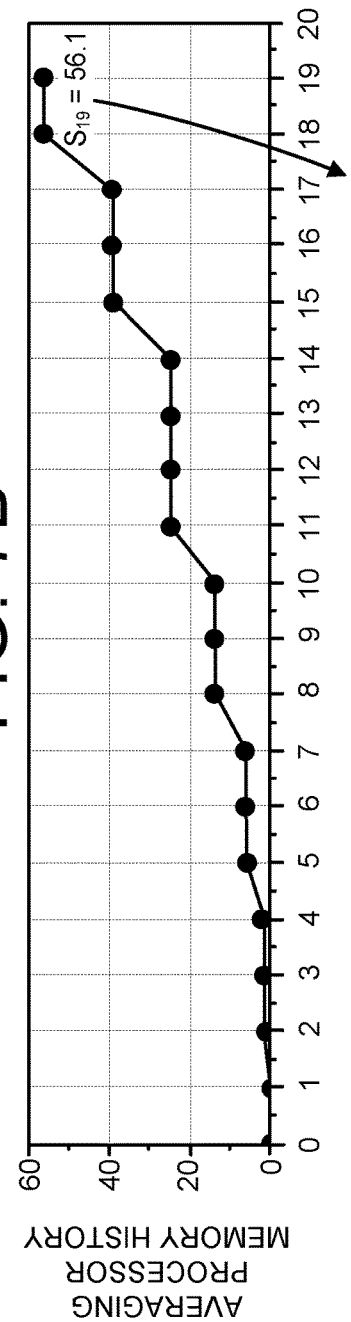

Here, $G_j$ is assumed to be used for an arithmetic operation only when its value is being transmitted. At this time, a history of $S_i$ is illustrated in FIG. 7C.
(3) The process of (2) is continued, and if final data is received, U is obtained by performing a calculation of Formula 1 by dividing a value held at a time point of i=19 (last) by N and further subtracting it from a count processor output value $C_i$ at that time. Therefore, it is preferable to use it as a final output. If a series of operations ends, the memory holding value $S_i$ is reset to 0, and a next series of operations is started. Here, when it is necessary to reduce a load of a division unit divided by N, there is a method of selecting a power of 2 as N and replacing it with a bit shift process.

The output U of the averaging processor 6 and a desired phase ϕ (unit radian) have the following relation of Formula 5.

$$\phi = \pi U \quad \text{(Formula 5)}$$

Here, ϕ is a phase (unit radian) of the input signal X. The phase is measured on the basis of the moment of measurement start (i=0). It is possible to calculate the phase (unit radian) by processing the output U in the FPGA, the PC, or the like on the basis of this relation. Of course, data U may be used in a subsequent process as is without replacing it with the phase (unit radian) as in Formula 5 in consideration of the subsequent process. Strictly, a constant ε is added to a right side of Formula 5. In theory, ε is a value which has a value of π or 0 and is uniformly determined by a sign of a value of the input signal at the moment of measurement start (i=0) and can be easily calculated. Specifically, if the value of the input signal at the moment of measurement start (i=0) is negative, ε=π. Therefore, it can be added to Formula 5 as the correction value.

In a measurement instrument that calculates and outputs results in real time, a function of setting a reference time at which measurement is started is required. In other words, a function of setting a phase of a time at which a certain reset signal is received during an operation to ϕ=0 and performing an arithmetic operation on subsequent output data on the basis of the reference time is desired. This function can be easily realized by a manipulation of resetting the value of the counter 43 of the count processor to 0 or initializing the process of the averaging processor at a timing at which the reset signal is received.

As the phase is calculated by the above-described process, it is possible to input a periodic signal of a wide frequency range, moreover it is possible to perform the measurement in real time with a high degree of accuracy. The example of implementing the digital signal processing by the FPGA has been described, but the present invention is not limited to the FPGA, and any other method such as an ASIC, a system LSI, or the like can be used as long as the digital signal processing can be implemented. Further, each input signal X is assumed to be a sinusoidal signal, but a pulse signal (also referred to as a "square wave signal") used in a digital circuit can be converted into a sinusoidal signal by applying a band pass filter or a low pass filter. Therefore, when the band pass filter is installed in front of the phase measurement device, it is possible to construct a phase measurement device for the pulse signal. Further, the calculated phase can be converted into the frequency of the input signal X by differentiating by time by a subsequent process. As described above, even when it is used as a frequency counter, it is possible to measure a frequency of a signal having a wide frequency variation range while securing high resolution and real time property. It is possible to perform the highly reliable measurement even on an input signal having a wide frequency variation range, that is, a large frequency noise at a high speed.

Example 2

Figure 8:
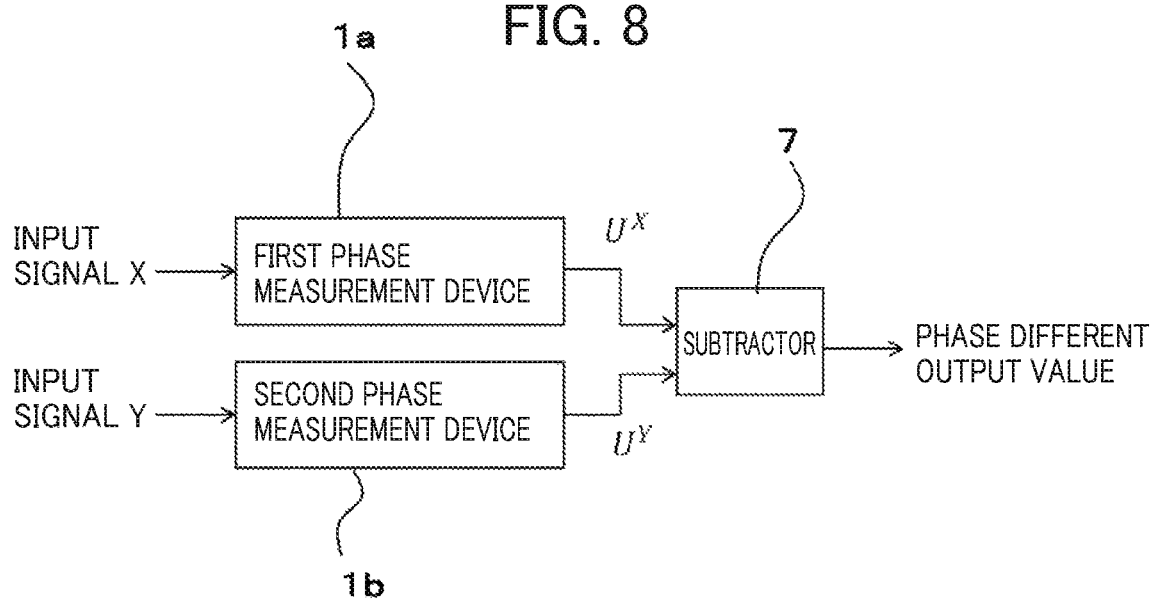
FIG. 8 is a diagram illustrating an overview of signal processing in a phase difference measurement device of the present invention.

Next, when a phase difference between two input signals X and Y is measured according to the present invention, that is, when it is used as a phase difference measurement device, preferably, two phase measurement devices having the above configuration are arranged as illustrated in FIG. 8, that is, a first phase measurement device 1a is used for an input signal X, a second phase measurement device 1b is used for an input signal Y, and measured phases $U^X$ and $U^Y$ are subtracted by a subtractor 7 to obtain a phase difference $(U^X - U^Y)$.

As the phase difference is calculated by the above-described process, it is possible to input two periodic signals of a wide frequency range, and moreover it is possible to perform the measurement in real time with a high degree of accuracy. The example of implementing the digital signal processing by the FPGA has been described, but the present invention is not limited to the FPGA, and any other method such as an ASIC, a system LSI, or the like can be used as long as the digital signal processing can be implemented.

Further, each of the input signals X and Y is assumed to be a sinusoidal signal, but a pulse signal (also referred to as a "square wave signal") used in a digital circuit can be converted into a sinusoidal signal by applying a band pass filter or a low pass filter. Therefore, when the band pass filter is installed in front of the phase difference measurement device, it is possible to construct a phase difference measurement device for the pulse signal.

Example 3

In this example, the phase difference measurement device of Example 2 is applied to a laser heterodyne displacement measurement device, and the present example will be described below using the input signal X as the reference signal and the input signal Y as the measurement signal.

A laser heterodyne interferometer is widely known as a measurement device using a phase difference of laser light. The laser heterodyne interferometer measures a displacement or the like occurring when a displacement, vibration, or a shock is given on the basis of a phase difference between reflected light of laser light from a measurement target and reference light using laser light which has undergone a frequency shift.

Figure 9:
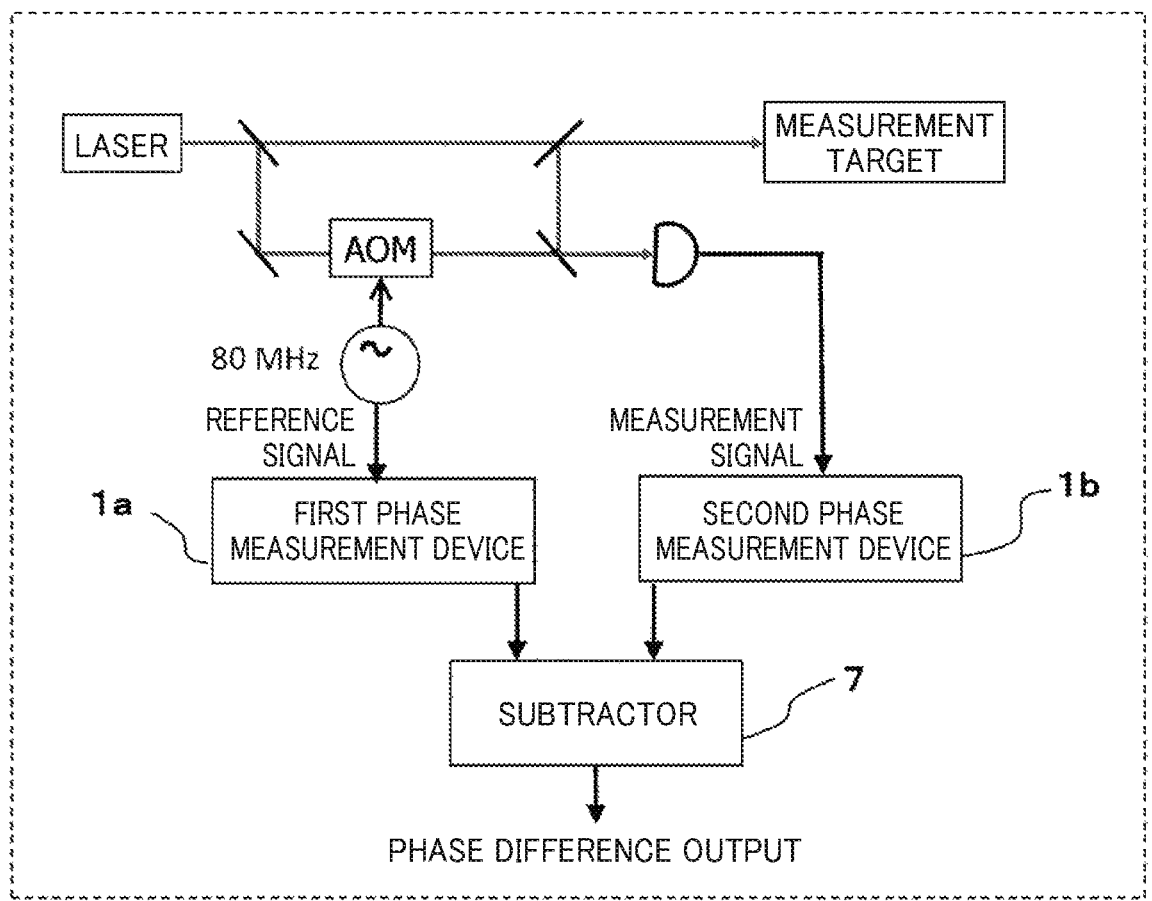
FIG. 9 is a diagram illustrating an overview of Example 3 applied to a laser heterodyne interferometer.

FIG. 9 illustrates an overview of Example 3 applied to the laser heterodyne interferometer. In the displacement measurement device using the laser heterodyne interferometer, for example, as a reference signal having a frequency of 80 MHz is input to a device which adds a frequency shift such as AOM (acousto-optic modulator) to laser light, for example, laser light which has undergone the frequency shift of 80 MHz and laser light reflected from the measurement target interfere with each other, so that a measurement signal in which phase modulation by the displacement of the measurement target is applied to 80 MHz is generated. In order to calculate the displacement from the two signals, that is, the measurement signal and the reference signal, the phase difference measurement device 1 according to Example 2 is applied to construct a laser heterodyne displacement measurement device.

Specifically, two sinusoidal input signals, that is, the measurement signal and the reference signal are input to the first phase measurement device 1a and the second phase measurement device 1b, respectively, and both signals are subtracted by the subtractor 7, so that the output data U related to the phase difference is obtained. Here, a relation between the data U obtained by the averaging processor 6 and the displacement (d [m]) of the measurement target is indicated by Formula 6. λ is a wavelength ([m]) of laser.

$$d=\lambda U/4 \qquad \text{(Formula 6)}$$

It is possible to calculate the displacement in real time by processing the output U in an FPGA, a PC, or the like on the basis of this relation.

In the present example, as illustrated in FIG. 9, the reference signal which is the input signal X is assumed to be an AOM drive signal, and the measurement signal which is the input signal Y is assumed to be an optical interference signal, but the laser heterodyne interferometer has various configurations. In general, however, the principle that the phase difference measurement device according to the present invention is used in the laser heterodyne interferometer is the same. Therefore, it is possible to obtain the similar effects to those of the present examples even when the phase difference measurement device part in the laser heterodyne interferometer is replaced with the phase difference measurement device based on Example 2 regardless of the example illustrated in FIG. 9.

The phase difference measurement device according to the present invention has two features, that is, a feature in which it is highly accurate and a feature in which it can be measured even when the phase difference greatly changes. Since these features respectively correspond to the "measurement resolution" and the "speed range of the measurement target" in the displacement measurement, a specific example of the present example is compared with the related art on the basis of two points.

First, we define the parameters necessary for analysis as follows.

(1) $f_h$: this is a heterodyne beat frequency and corresponds to the frequency of the reference signal in FIG. 9. In this example, it is assumed to be 80 MHz.

(2) $f_{ADC}$: this is a sampling rate for driving the AD converter and is 500 MHz in this example.

(3) $f_s$: this is a measurement sampling rate of displacement data desired to be obtained, and in this example, since N=20 is set, $f_s$=500/N=25 MHz. In a common laser heterodyne displacement meter, the measurement sampling rate is usually within the range of 1 kHz to 1 MHz.

(4) $V_{max}$: this is a measurable maximum speed [m/s] of the measurement target.

(5) $d_r$: this is a measurement resolution [m].

(6) λ: this is a wavelength of laser. In this example, it is set to 633 nm of helium-neon laser which is frequently used for the displacement measuring instrument. Of course, various other lasers can be applied.

First, the present example is compared with the counting technique of the related art which has the feature capable of cope with even when the speed range of the measurement target is high speed from a viewpoint of the measuring resolution. In the counting technique of the related art, only an integer value indicating a zero crossing count of an input signal (the measurement signal/the reference signal) can be measured. Therefore, in order to improve the resolution, a technique of multiplying the input signal by using a PLL circuit or the like or a technique of averaging a plurality of count values is often used. At this time, the measurement resolution can be indicated by the following Formula 7.

$$d_r=\lambda/4LQ \qquad \text{(Formula 7)}$$

Here, L is a multiplication rate by the PLL circuit, and Q is an averaging count. In commercially available products, a maximum of LQ=1024 is implemented, and $d_r$=λ/4096=approximately 0.155 nm is achieved. However, this technique requires a high-speed PLL circuit or the like, and a technical difficulty is high, and thus it is difficult to increase L. Further, increasing the averaging count Q is considered, but in principle, a maximum of about Q=2$f_h/f_s$ is a limit, and thus further improvement is unable to be expected.

On the other hand, according to the present example, it is possible to greatly exceed $d_r$=λ/4096 which is the highest level in commercially available products as the measurement resolution without using any PLL circuit at all. In other words, typically, the resolution can be indicated by the following Formula 8.

$$d_r=\lambda/(4N\cdot 2^n) \qquad \text{(Formula 8)}$$

Here, n indicates the number of conversion bits of the AD converter, and if n=8 bits is set, $d_r$=0.03 nm is obtained because the averaging count N is 20 in the present example. In a case of $f_s$=1 MHz which is widely used, since N=500, it is derived that:

$d_r$=0.0012 nm.

Thus, it can be understood that the resolution is improved about 100 times in the present example as compared with about 0.155 nm which is the resolution according to the counting technique according to the related art.

Next, the present example is compared with the demodulation technique of the related art having the excellent measurement resolution from a viewpoint of the speed range of the measurement target. In the demodulation technique, it is necessary to apply a low pass filter in which a frequency which is less than ½ of the measurement sampling rate is used as a cutoff frequency $f_c$ in accordance with a "sampling theorem" in an information theory. In other words, it is necessary to satisfy the following Formula 9.

$$f_c < f_s/2 \quad \text{(Formula 9)}$$

Here, the cutoff frequency $f_c$ limits a measurable maximum speed in accordance with the following Formula 10.

$$(2v_{max})/\lambda = f_c \quad \text{(Formula 10)}$$

The following Formula 11 is derived from the above.

$$v_{max} = (\lambda f_s)/4 \quad \text{(Formula 11)}$$

Now, fs=1 MHz which is a high value is employed as the measurement sampling rate, but about vmax=about 0.16 m/s is still a limit.

On the other hand, in the speed range of the measurement target according to the present example, it is possible to measure the input signal which is less than ½ of the AD converter sampling rate from the sampling theorem. In other words, the relation between $f_{ADC}$ and $v_{max}$ is indicated by the following Formula 12.

$$f_{ADC} = 2(2f_h + 4v_{max}/\lambda) \quad \text{(Formula 12)}$$

When transposed, $$v_{max} = \lambda (f_{ADC} - 4f_h)/8 \quad \text{(Formula 13)}$$

If a value used as an example is now substituted, $v_{max}$=14.2 m/s is obtained. If this value is compared with the speed range $v_{max}$=about 0.16 m/s in the demodulation technique, it can be understood that Example 3 is expanded by about 100 times.

A comparison with the related art is performed from viewpoints other than the resolution and the speed range. First, in the method according to the present invention, a real-time process is possible even on a high-speed input signal. On the other hand, in the zero crossing analysis technique, since the zero crossing time of the signal is calculated from digitized data, in order to apply complex calculations to data temporarily stored in a memory, for example, it is extremely difficult to process a high-speed signal such as 80 MHz in real time in the present example. Furthermore, the method according to the present invention is as strong in resistance to amplitude variation as the counting technique. On the other hand, the demodulation technique has weaknesses. Specifically, when an amplitude of a signal varies for a very short time due to influence of noise or the like, an output is sensitive to, for example, a case in which a bias is applied to a signal or the like, and thus it is undesirable.

The advantages of Example 3 described above as compared with the related art (the demodulation technique, the counting technique, and the zero crossing technique) are illustrated in FIG. 10 from the viewpoints of the measurement resolution, the speed range of the measurement target, whether or not the real-time process is possible, a necessary clock speed, processing complexity, and resistance to amplitude variation of a signal. As described above, according to the present example, the related art has the disadvantages from all the viewpoints, but according to the present example, the requirements can be satisfied from all the viewpoints.

In a case in which it is desired to obtain a speed signal of the measurement target as in a laser Doppler vibrometer, it is possible to calculate it easily by time-differentiating a displacement signal measured with the laser heterodyne displacement measurement device.

Example 4

Figure 11:
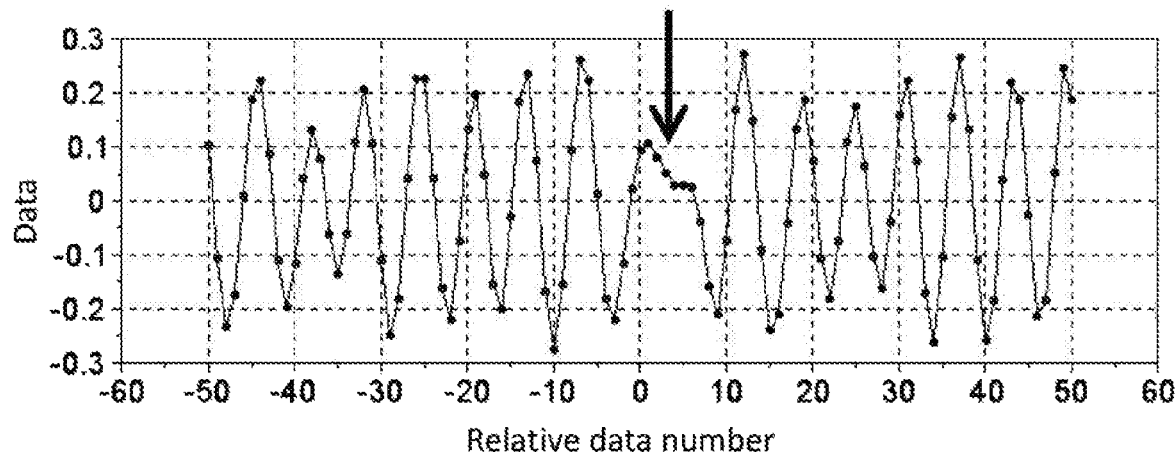
FIG. 11 is a diagram illustrating an example in which zero crossing which should be present is lost due to noise.

Noise phenomena such as loss of zero crossing to be detected or detection of unnecessary zero crossing occurs when the input signal is influenced by noise or when a signal to noise ratio (S/N) is small. The accurate measurement is unable to be performed due to the noise phenomenon when the average value Ca of the output value of the counter 43 is calculated at each sampling timing for such a signal as previously suggested. On the other hand, if the present invention is applied, even when the loss of zero crossing or the excessive detection occurs due to the influence of noise, the measurement can be performed with a high degree of accuracy if the correction operation is performed to remove the influence. First, a correction function when zero crossing is lost will be described below. In an example of FIG. 11, the zero crossing which should be originally present is lost due to influence of noise near a data position 0. In a case in which zero crossing is lost as described above, the measurement result has an undesirable (non-inherent) step-like characteristic. In a case in which zero crossing is lost as described above, if zero crossing at the time of transition from a negative side to a positive side is lost, zero crossing at the time of transition from the positive side to the negative side is also lost, and thus correction is performed using the fact that two things are necessarily lost as a set in principle.

Figure 12:
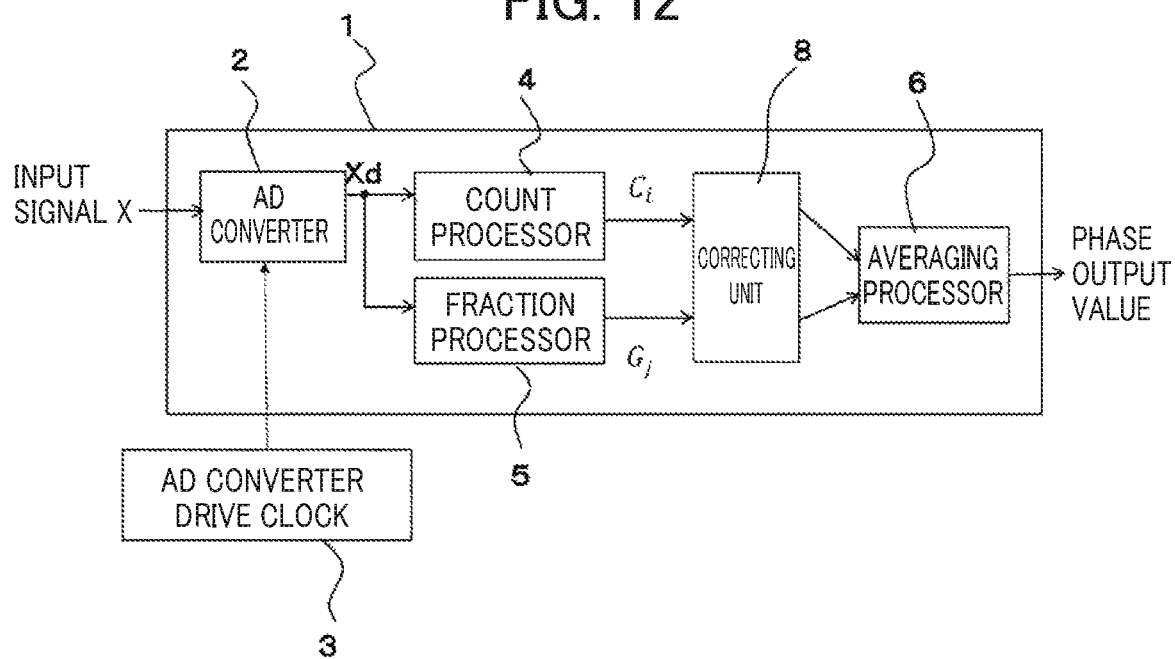
FIG. 12 is a block diagram for correcting a noise phenomenon according to the present invention.

FIG. 12 is a block diagram for performing this process. The same reference numerals are assigned to components common to Example 1. In this process, the following procedure is applied.

(1) Results are consistently transmitted from the count processor 4 and the fraction processor 5 to a correcting unit. The correcting unit 8 has a function of determining whether or not there is a zero crossing detection abnormality in the received result and performs the correction.

(2) The determination of whether or not the zero crossing detection fails in the correcting unit 8 is performed as follows. First, a difference $\Delta G_j = G_{j+1} - G_j$ of a value transmitted from the fraction processor 5 is consistently monitored. If this value exceeds a certain threshold value, it is determined that the zero crossing is lost. A threshold value is a value decided using an average frequency of the input signal and may be assigned a fixed value as an initial setting or may be decided by multiplying a long-time average of $\Delta G_j$ by an appropriate coefficient (usually larger than 1 and 2 or less). Further, when four or more zero crossings are lost, it means that $\Delta G_j$ greatly exceeds the threshold value, and thus, for example, the number of lost zero crossings is determined on the basis of how many times $\Delta G_j$ is the threshold value (2, 4, 6, 8, . . . ).

(3) If it detects that zero crossing is lost, the correcting unit 8 performs the following processing on the received data and transmits resulting data to the subsequent averaging processor 6. Here, it is assumed that a j-th difference $\Delta G_j$ exceeds the threshold, and that the number of lost zero crossings is two. First, a change of C→C+2 is performed for data from the count processor 4.

Then, two pieces of data, that is, $G_{j+1}$ and $G_j$ are added to the data from the fraction processor 5. The reason for this process will be described. In the present algorithm, since the fraction processing parameter G is a variable indicating a position of zero crossing, two lost zero crossings can be approximated with the value of zero crossing that can be normally detected next to it. In other words, for example, two pieces of data, that is, $G_k$ and $G_{k+1}$ (k is arbitrary j) are assumed to be lost. At this time, since an approximate equation $G_k+G_{k+1}=G_{k-1}+G_{k+2}$ holds, it is desirable to add $G_{k-1}$ and $G_{k+2}$ which are detected normally to the data of the fraction processor 5 (they overlap since there are already $G_{k-1}$ and $G_{k+2}$ in the data sequence). In addition, originally $G_k \neq G_{k-1}$ and $G_{k+1} \neq G_{k+2}$ are held, but since the averaging processor 6 at the subsequent stage takes a sum of G, it is sufficient if two pieces of data, that is, $G_{k-1}$ and $G_{k+2}$ whose sums are the same are added as indicated in the approximate equation, and it is unnecessary to perform an estimation process of $G_k$ alone which requires a complicated process.
4) The correction can be performed with a similar concept if the number of lost zero crossings is more than 2, that is, 2p (p is an integer of 2 or more). Specifically, if the j-th difference $\Delta G_j$ exceeds the threshold value, a change of C→C+2p is performed for the data from the count processor 4. For the data of fraction processor 5, p sets of $G_{j+1}$ and $G_j$ are added to the data sequence.

A correction method when the zero crossing is detected excessively can also be performed similarly. In other words, if $\Delta G_j$ falls below a predetermined threshold value, it is desirable to delete $G_k+G_{k+1}$ from the fraction processor and performs a change of C→C-2 for the data from the count processor.

The following various effects are obtained by this technique.

(1) In the heterodyne laser interferometer, when return light to the interferometer is weak in measurement or the like on a low reflectance surface or a rough surface, since the S/N of the input signal is small, a phenomenon that the zero crossing is lost or excessively detected occurs due to the influence of the noise as described above. In this regard, it is possible to perform measurements in which the accuracy on the low reflectance surface is maintained by applying such a process. Thus, for example, there is an effect in that it is not necessary to cause a mirror or a reflector for enhancing reflectance to adhere to a measurement target object.

(2) In the phase noise measurement device, there is a need to measure the input signal with a small S/N ratio. For example, there are many situations in which it is desired to measure an optical beat signal, a signal obtained by amplifying a received radio signal, or the like. In this case, the phase measurement of the present invention can be applied by applying this example.

Figure 13:
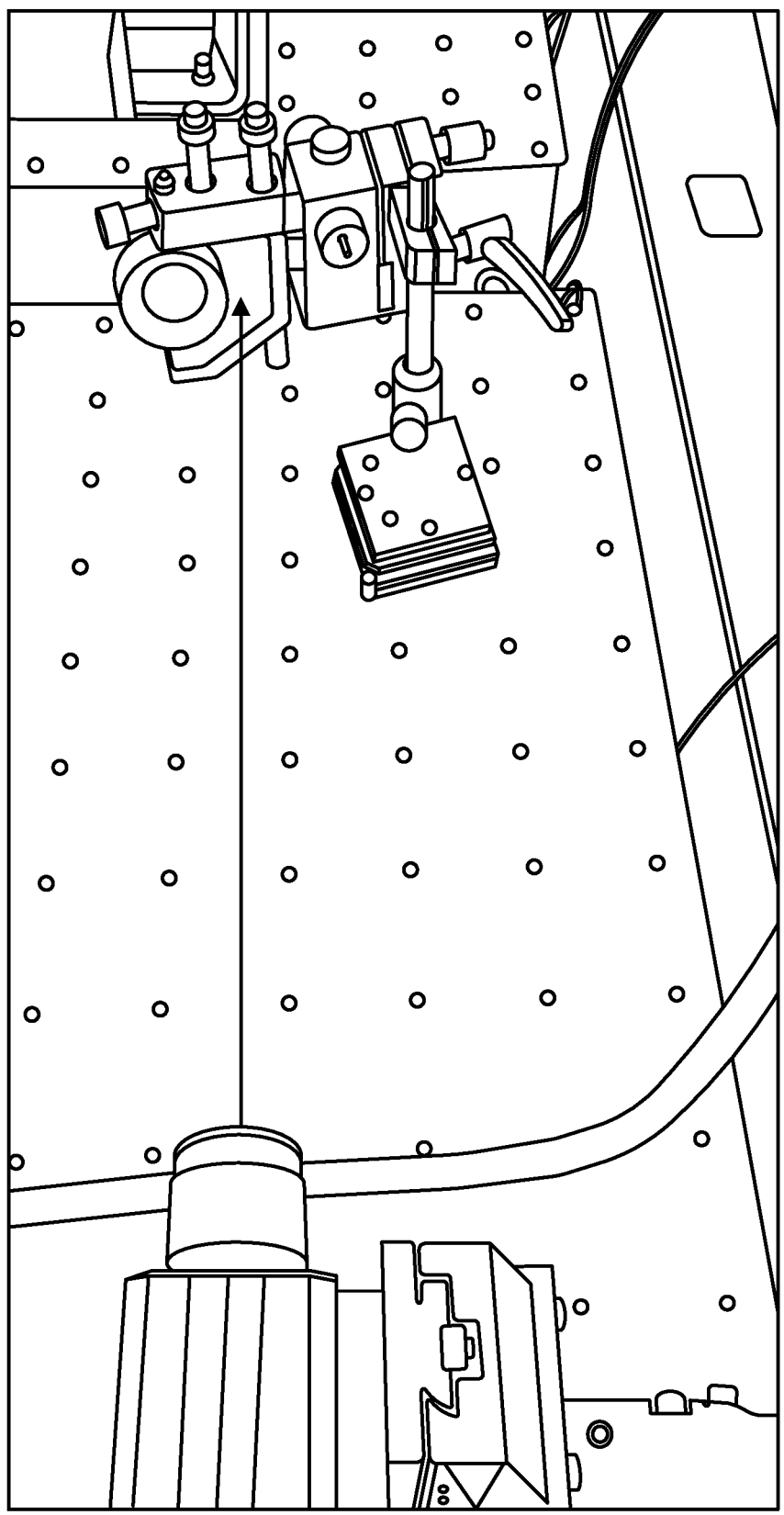
FIG. 13 is a diagram illustrating an example of high sensitivity measurement by a heterodyne laser interferometer.
Figure 14A:
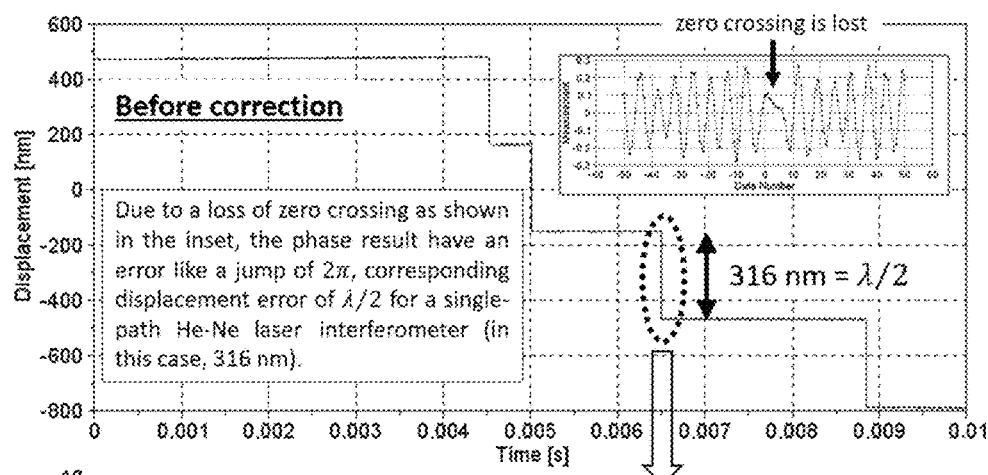
FIGS. 14A and 14B are diagrams for describing effects of noise phenomenon correction.
Figure 14B:
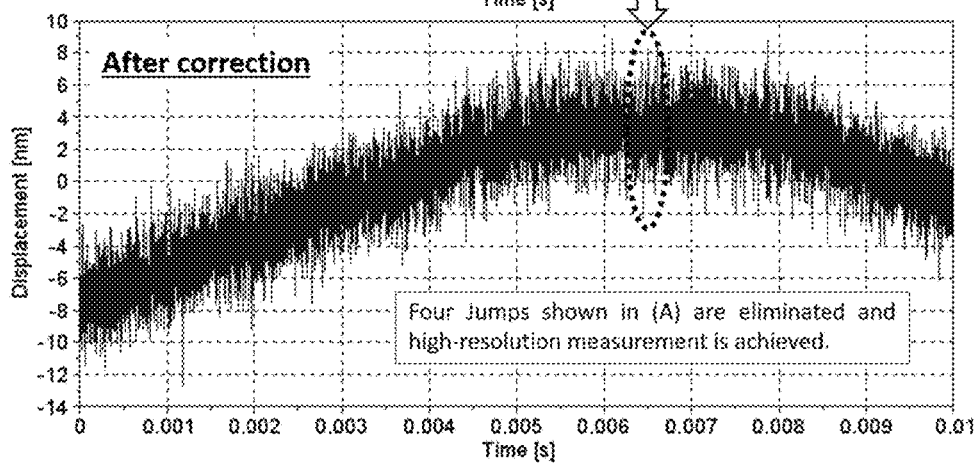

An example of high sensitivity measurement by the heterodyne laser interferometer will be described as an application example. FIG. 13 illustrates an example in which vibration is applied to a black alumite surface with low reflectance, and laser is radiated from a position of 30 cm, and a vibration displacement is measured. In this setup, if data of the heterodyne laser interferometer is processed using a phase measurement algorithm without applying the present example, an output value illustrated in FIG. 14A is obtained. In FIG. 14A, since return signal strength is weak, zero crossings are lost many times, and thus a deviation from a true value occurs by an integral multiple of a half wavelength of laser (316 nanometers in this example) each time. As described above, the measurement itself becomes invalid due to the noise phenomenon. On the other hand, if the correction described in the present example is applied, an output value illustrated in FIG. 14B is obtained. This measurement result accurately coincides with the vibration applied to the black alumite surface. As described above, it is confirmed that if the correction described in the present example is applied even when the return signal strength is weak in measurement or the like on a low reflectance surface or a rough surface, the high-accuracy measurement can be performed.

The measurement result by the present invention has a high frequency variation which is unavoidable in principle, but it is possible to perform the correction to reduce it. In other words, in the present invention, since the phase of the periodic signal is measured by detecting and processing the zero crossing of the periodic signal, the high frequency variation occurs since the number of zero crossings changes due to influence of a method (boundary) of dividing an interval in which averaging is performed. An example will be described below. For example, it is assumed that, when a certain input signal is measured with the averaging count N, an average of M zero crossings arrive between N pieces of data output from the AD converter. In this case, for example, after M zero crossings are detected in certain N pieces of data, M+1 zero crossings are detected in a next series of N pieces of data, and M−1 zero crossings are detected in a next series of N pieces of data, that is, M zero crossings are not necessarily detected in all intervals, but the number of zero crossings is changed by ±1, and thus noise-like characteristic which should not originally occur (this is referred to as a high frequency variation) occurs in the measurement result. The influence of this phenomenon increases as the averaging count N decreases since M is also generally a smaller value. This is because a relative difference between M+1 and M becomes large.

Figure 15:
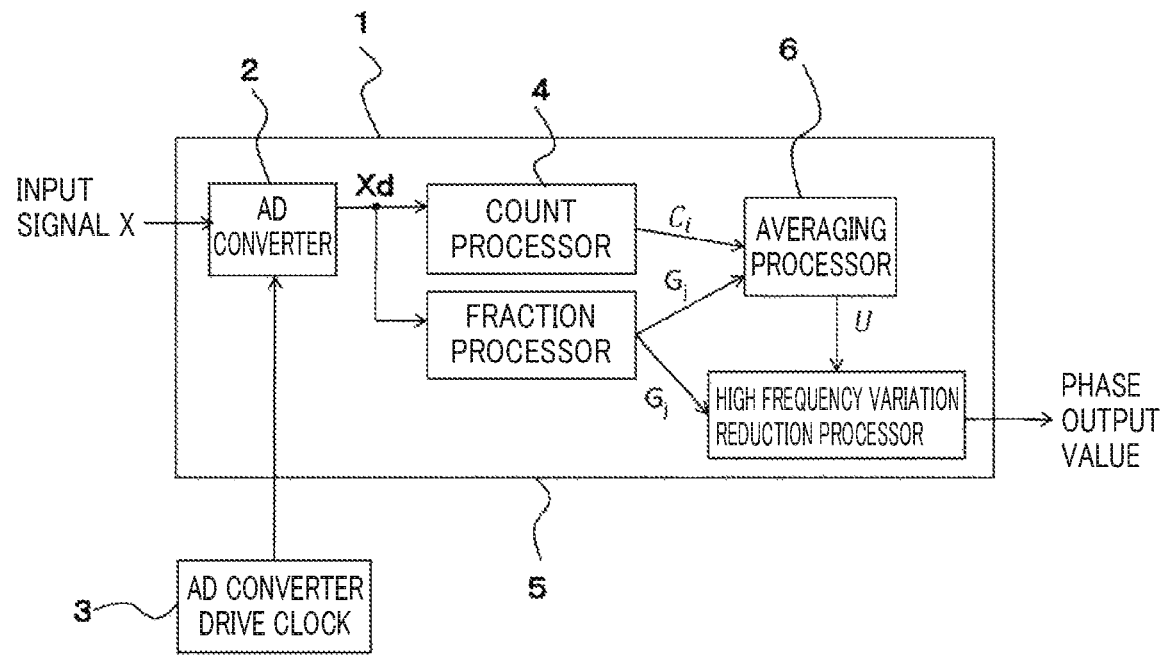
FIG. 15 is a block diagram illustrating a process of reducing a high frequency variation.

In this regard, in order to alleviate the influence of the high frequency variation, in this example, the correction process is introduced in accordance with a block diagram illustrated in FIG. 15. In a high frequency variation reduction processor, the data $G_j$ from the fraction processor is received and monitored. Here, in the high frequency variation reduction processor, the following process is performed. First, last data from the fraction processor 5 in a k-th averaging interval (p-th data in the averaging interval) is indicated by $G_p(k)$, first data from the fraction processor 5 in a next ((k+1)-th) averaging interval (first data in the averaging interval) is indicated by $G_1(k+1)$, and a correction value Q(k) is calculated on the basis of the following:

$$Q(k)=(G_1(k+1)+G_p(k)-N)^2/(G_1(k+1)-G_p(k)+N)/8 \quad \text{(Formula 14)}.$$

This correction value Q(k) is a value obtained by theoretically estimating an extra value measured by the influence of the boundary of the interval. The output value U of the averaging processor is also transmitted to the high frequency variation reduction processor, and the correction is applied to it. More specifically, the value Q(k) is subtracted from an output value U(k+1) of the (k+1)-th averaging interval, and Q(k) is added to the output value U(k) of the k-th averaging interval. Accordingly, the phenomenon that the apparent noise is mixed into the measurement result due to the influence of the number of zero crossings varying between the averaging intervals is alleviated, and particularly, when the N value is small (when it is desired to observer the phase variation up to the high frequency region), the accurate measurement is performed more precisely. Since the calculation of Formula 14 has a large calculation load, the calculation of the correction value Q(k) is not performed in real time and can be performed by post-processing. For example, if values of $G_1(k)$ and $G_p(k)$ are stored for all k and transmitted to a computer or the like, it is possible to execute the correction by calculating $Q(k)$ by Formula 14 on the computer.

Example 6

The present example is applied to the phase noise measurement device. Here, the phase noise measurement device is a device that measures a time history of a phase fluctuation (noise) of a certain signal. The phase noise is also referred to as a phase jitter and is an important index for evaluating stability of a high frequency signal source. For this reason, the phase noise measurement device is an instrument indispensable for research and development of high-speed communication instruments or the like. In order to implement the phase noise measurement device to which the present invention is applied, it is desirable to input a measured signal as the input signal X in FIG. 1. In this case, phase noise measurement performance (self noise of the phase noise measurement device itself) is decided by a jitter (phase noise level) of an AD converter drive clock. For this reason, when it is desired to perform measurement with lower noise, it is desirable to introduce a high stable reference signal to the drive clock.

Figure 16:
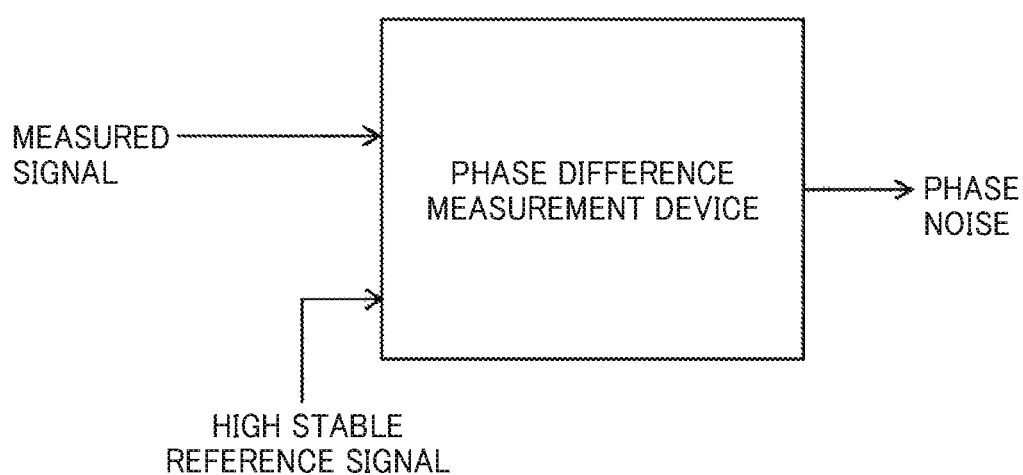
FIG. 16 is a diagram illustrating an overview of an example applied to a phase noise measurement device.

Alternatively, in FIG. 8, it is preferable that a measured signal be input as the input signal X of the phase difference measurement device, and a high stable reference signal is input as the input signal Y. In this case, it is possible to measure the phase noise of the measured signal without being affected by the phase noise level of the AD converter drive clock. FIG. 16 illustrates an application diagram. Here, the high stable reference signal is a periodic signal serving as a reference for measurement with extremely small phase noise and is obtained by, for example, an atomic clock. Here, the measured signal and the high stable reference signal are used as the input signals X and Y, respectively, but they may be reversed.

When the present invention is applied, it is possible to measure even when frequencies of the measured signal and the high stable reference signal are significantly different. Specifically, if the frequency of the measured signal is indicated by $f_A$, and the sampling rate for driving the AD converter is indicated by $f_{ADC}$, the measurement can be performed within a range of $f_A < f_{ADC}/4$, and it is possible to increase the phase noise measurement resolution at the same time. In other words, if the number of conversion bits (for example, n=8 bits) of the AD converter is indicated by n, the averaging count is indicated by N, and the resolution of the phase noise is indicated by d (unit radian), there is a relation $d=2\pi/(N \cdot 2^n)$.

Further, according to the present invention, even when the phase noise level of the measured signal is very large, for example, even when the variation of the phase significantly exceeds $2\pi$, the highly reliable measurement can be performed. Specifically, a comparison with a phase noise measurement device according to a known technique will be described. As an existing phase noise measurement device, there are (A) a high precision type using a spectrum analyzer or a PLL, and (B) a type having a wide range for AD conversion and analysis as in an oscilloscope.

In (A), in the case of a signal having a too large phase noise, the measurement is unable to be measured since the measurement is out of the range. On the other hand, according to the present technology, since the frequency range of the measured signal is wide, it is possible to continue the measurement even when the phase noise is large, and thus there is no problem at all. In (B), in the case of a signal with a large phase noise, the measurement can be performed, but on the other hand, since a memory capacity is restricted, the measurement is unable to be performed in a region having a low offset frequency in which it is necessary to acquire data for a long time. In the present technology, since the real-time process can be performed, it is possible to perform the measurement with high reliability up to the region in which the offset frequency is extremely low.

INDUSTRIAL APPLICABILITY

As described above, according to the present invention, it is possible to input a periodic signal of a wide frequency range with a simple circuit configuration, and moreover, it is possible to accurately measure a phase or a phase difference in real time at equal time intervals, and thus the present invention can be expected to be applied to various instruments such as a laser heterodyne displacement measurement device and a phase noise measurement device.

EXPLANATION OF REFERENCE NUMERALS

1 PHASE MEASUREMENT DEVICE
1a FIRST PHASE MEASUREMENT DEVICE
1b SECOND PHASE MEASUREMENT DEVICE
2 FIRST AD CONVERTER
3 DRIVE CLOCK
4 COUNT PROCESSOR
5 FRACTION PROCESSOR
6 AVERAGING PROCESSOR
7 SUBTRACTOR
8 CORRECTING UNIT
41 ZERO CROSSING SPECIFICATION MEANS
43 COUNTER
44 UP/DOWN COUNTER

The invention claimed is:

1. A phase measurement device that measures a phase of a periodic input signal varying periodically through a digital circuit, comprising:

an AD (analog to digital) converter that digitizes the periodic input signal at each predetermined sampling timing and outputs a digital signal;

a count processor that controls a zero crossing specifying detecting a change in a sign of the digital signal and counts and calculates a zero crossing detection count C through the zero crossing specifying at each sampling timing;

a fraction processor that calculates a fraction $F_j$ (j=1 to L) of the zero crossing detection count on the basis of the digital signals at sampling timings immediately before the zero crossing specifying and when the zero crossing specifying and further calculates a fraction processing parameter $G_j = N_j - F_j$ using a zero crossing detection number $N_j$ ($0 \leq N_j \leq N-1$) in a period of a predetermined sampling count N (the number of data to be averaged) necessary for averaging; and an averaging processor that averages the count processor calculation value that is the zero crossing detection count C when the period ends and L fractions calculated by the fraction processor in a period of the sampling count N using Formula 1 (L indicates the number of $G_j$ included between the averaging counts N) and calculates a phase of the digital signal.

$$U = C - \frac{1}{N}\sum_{j=1}^{L} G_j \qquad \text{(Formula 1)}$$

2. The phase measurement device according to claim 1, wherein outputs of the count processor and the fraction processor are input to a correcting unit, and, when a difference $\Delta G_j$ ($G_{j+1}-G_j$) of the adjacent fraction processing parameters $G_j$ exceeds a predetermined threshold value, the correcting unit estimates a lost zero crossing detection count on the basis of the difference $\Delta G_j$, adds the lost zero crossing detection count to the zero crossing detection count calculated by the count processor, and estimates the lost fraction processing parameter on the basis of values of the fraction processing parameters $G_j$ immediately before and immediately after the zero crossing is lost.

3. The phase measurement device according to claim 1, wherein outputs of the count processor and the fraction processor are input to a correcting unit, and, when a difference $\Delta G_j$ ($G_{j+1}-G_j$) of the adjacent fraction processing parameters $G_j$ exceeds a predetermined threshold value, the correcting unit estimates an erroneously detected zero crossing detection count on the basis of the difference $\Delta G_j$, subtracts the erroneously detected zero crossing detection count from the zero crossing detection count calculated by the count processor, and subtracts a value of the fraction processing parameter $G_j$ on the basis of the erroneously detected zero crossing.

4. A phase difference measurement device, comprising:
the phase measurement device according to claim 1 arranged as each of first and second phase measurement devices for a first periodic input signal X and a second periodic input signal Y, the periodic input signal including the first periodic input signal X and the second periodic input signal Y; and
a subtractor that subtracts a phase of the second periodic input signal Y measured by the second phase measurement device from a phase of the first periodic input signal X measured by the first phase measurement device,
wherein the phase difference measurement device measures a phase difference between the first periodic input signal X and the second periodic input signal Y.

5. The phase measurement device according to claim 1, wherein, when a sampling rate for driving the AD converter is indicated by $f_{ADC}$, and an averaging count of the averaging processor is indicated by N, a phase difference calculation rate obtained in the averaging processor is $f_{ADC}/N$.

6. The phase difference measurement device according to claim 4, wherein, when a sampling rate for driving the AD converter is indicated by $f_{ADC}$, and an averaging count of the averaging processor is indicated by N, a phase difference calculation rate obtained in the averaging processor is $f_{ADC}/N$.

7. A displacement measurement device using the phase difference measurement device according to claim 4, the displacement measurement device is a device using a laser heterodyne interferometer that causes reflected light when a measurement target is irradiated with laser light to interfere with reference light obtained by adding a frequency shift to the laser light, and measures a displacement of the measurement target on the basis of a phase difference between the reflected light and the reference light, the displacement measurement device comprising:
the phase difference measurement device according to claim 4, the first periodic input signal X being input as the reflected light, the second periodic input signal Y being input as the reference light; and
a processor for controlling an arithmetic operation that calculates the displacement of the measurement target on the basis of an output of the averaging processor.

8. The displacement measurement device according to claim 7, wherein, when a resolution of the displacement measurement device is indicated by $d_r$, and a maximum value of a measurable speed range is indicated by $v_{max}$, the following relation is satisfied:

$$d_r = \lambda/(4N \cdot 2^n)$$

$$v_{max} < \lambda(f_{ADC}-4f_h)/8$$

where $\lambda$ indicates a wavelength of laser, N indicates an averaging count, n indicates the number of conversion bits of the AD converter, $f_{ADC}$ indicates a sampling rate of the AD converter, and $f_h$ indicates a frequency of the reference signal.

9. A phase noise measurement device that compares an input signal with a high stable reference signal and measures a time history of a phase fluctuation of the input signal, comprising:
the phase difference measurement device according to claim 4, one of the first periodic input signal X and the second periodic input signal Y being used as the input signal, the other being used as the high stable reference signal,
wherein the phase fluctuation of the input signal is measured on the basis of an output of the averaging processor.

* * * * *